(12) United States Patent
Amos et al.

(10) Patent No.: US 7,479,436 B2
(45) Date of Patent: Jan. 20, 2009

(54) FEED FORWARD SILICIDE CONTROL SCHEME BASED ON SPACER HEIGHT CONTROLLING PRECLEAN TIME

(75) Inventors: Ricky S. Amos, Rhinebeck, NY (US); Bryant C. Colwill, Staatsburg, NY (US); Kevin E. Mello, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 552 days.

(21) Appl. No.: 11/306,717

(22) Filed: Jan. 9, 2006

(65) Prior Publication Data

US 2008/0188014 A1 Aug. 7, 2008

(51) Int. Cl.
*H01L 21/336* (2006.01)

(52) U.S. Cl. ............... 438/303; 438/595; 257/E21.626; 257/E21.64

(58) Field of Classification Search ................ 438/184, 438/230, 303, 595; 257/E21.626, E21.64
See application file for complete search history.

(56) References Cited

U.S. PATENT DOCUMENTS

| 6,630,361 | B1 | 10/2003 | Singh et al. |
| 6,697,697 | B2 | 2/2004 | Conchieri et al. |
| 6,858,361 | B2 | 2/2005 | Mui et al. |
| 7,109,086 | B2 * | 9/2006 | Kammler et al. ............ 438/303 |

* cited by examiner

*Primary Examiner*—Hoai v Pham
(74) *Attorney, Agent, or Firm*—Gibb & Rahman, LLC; Joseph P. Abate, Esq.

(57) ABSTRACT

Embodiments herein present a method for a feed forward silicide control scheme based on spacer height controlling pre-clean time. The method forms field effect transistor gates over a substrate and then forms spacers on the gates. Next, the method measures the spacers using an atomic force microscope to determine a measured spacer height. The method then conducts a pre-cleaning etch, wherein a duration of the pre-cleaning is adjusted according to the measured spacer height. If the measured spacer height is below a predetermined amount, the duration of the pre-cleaning is reduced; and, if the measured spacer height is above a predetermined amount, the duration of the pre-cleaning is increased.

20 Claims, 3 Drawing Sheets

FEED FORWARD SILICIDE CONTROL SCHEME BASED ON SPACER HEIGHT CONTROLLING PRECLEAN TIME

BACKGROUND OF THE INVENTION

1. Field of the Invention

Embodiments herein present a method for a feed forward silicide control scheme based on spacer height controlling pre-clean time.

2. Description of the Related Art

Conductive materials, such as silicide, are often formed on the surfaces of semiconductors in order to reduce electrical resistance. A conventional semiconductor, such as a complementary metal oxide silicon (CMOS) device, typically comprises field effect transistors (FETs). Moreover, each FET has a gate stack, which may be offset by one or more spacers. As more fully described below, spacers are conventionally used to protect the sidewalls of a gate stack during the processes required to form silicide on a top surface of the gate stack and within the source/drain region of a transistor.

Prior to the formation of silicide, the CMOS device undergoes a conventional pre-clean process to prepare the top surface of the gate stack and the source/drain region for silicide formation. Unfortunately, the spacers are typically not resistant enough to withstand the pre-clean process, and portions of the spacer may become inadvertently removed. As a result, portions of the gate stack sidewall become exposed. The exposed portions of the gate stack sidewall are then susceptible to silicide formation.

Silicide formed on the sidewalls of the gate stack can lead to electrical shorts between the silicide on the top of the gate stack and the silicide within the source/drain region at the base of the gate stack. As semiconductor devices are continually being scaled down, and the distance between the top of the gate stack and the source/drain region is being reduced, the likelihood of electrical shorts due to the silicide formed on the sidewalls of the gate stack increases.

Furthermore, the pre-clean process can shift the gate stack, damage the screen oxide, and lead to PC to silicon leakage, all of which degrades yield. Thus, a solution is required to avoid the aforementioned disadvantages while increasing performance and yield of the semiconductor with no added cost.

SUMMARY OF THE INVENTION

Embodiments herein present a method for a feed forward silicide control scheme based on spacer height controlling pre-clean time. The method forms field effect transistor (FET) gates over a substrate and then forms spacers on the gates. Next, the method measures the spacers using an atomic force microscope (AFM) to determine a measured spacer height.

The method then conducts a pre-cleaning etch using, for example, a hydrofluoric acid—ethylene glycol solution, wherein the duration of the pre-cleaning is adjusted according to the measured spacer height. If the measured spacer height is below a predetermined amount, the duration of the pre-cleaning is reduced; and, if the measured spacer height is above a predetermined amount, the duration of the pre-cleaning is increased.

Thus, by adjusting the duration of the pre-cleaning etch according to the measured spacer height, shifting of the gates and spacer pull-down are avoided. Moreover, by adjusting the duration of the pre-cleaning etch according to the measured spacer height, all the spacers can have identical heights, which facilitates consistent semiconductor resistance. Following this, silicide is formed on the substrate and the gates.

Accordingly, the method measures spacer shoulder height with an atomic force microscope, and feeds this information forward to a pre-silicide hydrofluoric ethylene glycol (HF/EG) etch. The HF/EG etch time can be adjusted according to the spacer step height measurement. Since the device is already formed at the HF/EG step, there is no danger of shifting the device, and since the spacer height can be made consistent, good silicide formation is guaranteed, and consistency is improved as well.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
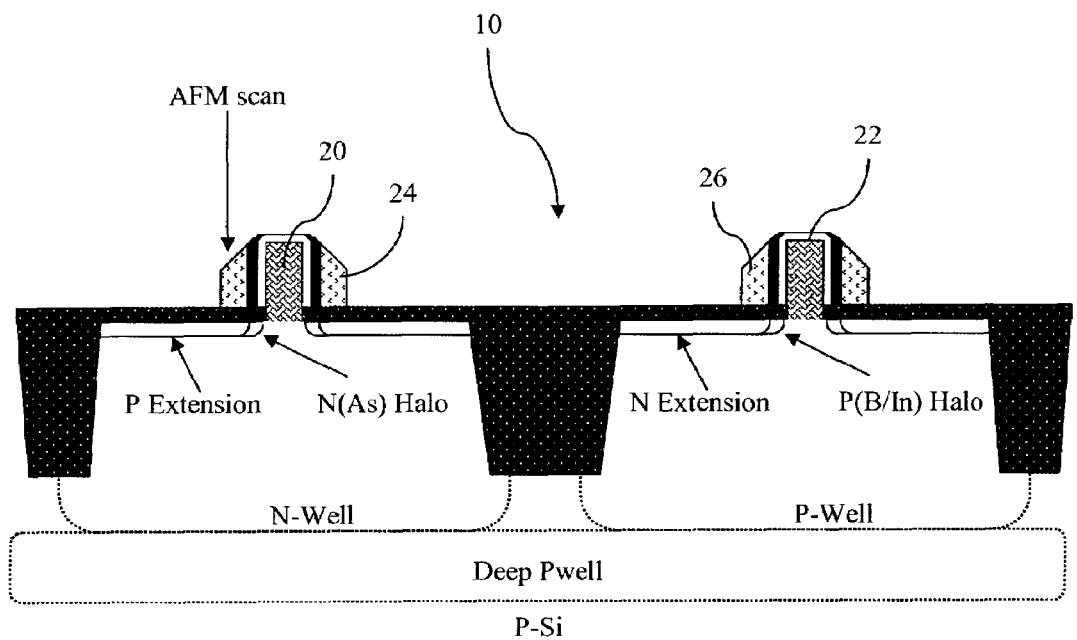
FIG. 1 illustrates a typical complementary metal oxide silicon (CMOS) device.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

Embodiments of the invention measure spacer shoulder height with an atomic force microscope, and feed this information forward to a pre-silicide HF/EG etch. The HF/EG etch time can be adjusted according to the spacer step height measurement. Since the device is already formed at the HF/EG step, there is no danger of shifting the device, and since the spacer height can be made consistent, good silicide formation is guaranteed, and consistency is improved as well.

More specifically, referring out to the drawings, FIG. 1 illustrates a typical CMOS device comprising a substrate 10. The substrate 10 may comprise silicon, or other similarly used material. Gate stacks 20, 22 are formed using conventional processes, and can comprise polysilicon, or other similarly used material. Many of the conventional processes mentioned herein are described in previous patents and publications, such as U.S. Pat. No. 6,697,697, which is incorporated herein by reference.

Spacers 24, 26 are formed along the sidewalls of the gate stacks 20, 22, respectively, wherein the spacers 24, 26 may comprise an oxide material or other similarly used material. The spacers 24, 26 may be formed using an oxidation process wherein oxide is deposited on the sidewalls of the gate stacks 20, 22 using chemical-vapor deposition (CVD), plasma-enhanced chemical-vapor deposition (PECVD), or other similar process. The oxide is then etched using a reactive ion etch (RIE), or other similar process.

To prepare the surface of the substrate 10 for the formation of a conductive material, the surface of the substrate 10 is cleaned using a pre-clean process. The pre-clean process, for example, utilizes hydrofluoric ethylene glycol (HF/EG), hydrofluoric acid (HF), buffered hydrofluoric acid (BHF), etc. During the pre-clean process, the spacers 24, 26 are etched due to a lack of etch resistance. As more fully described below, to avoid excess etching of the spacers 24, 26, the duration of the pre-clean process is adjusted according to the height of the spacers 24, 26.

Figure 2:
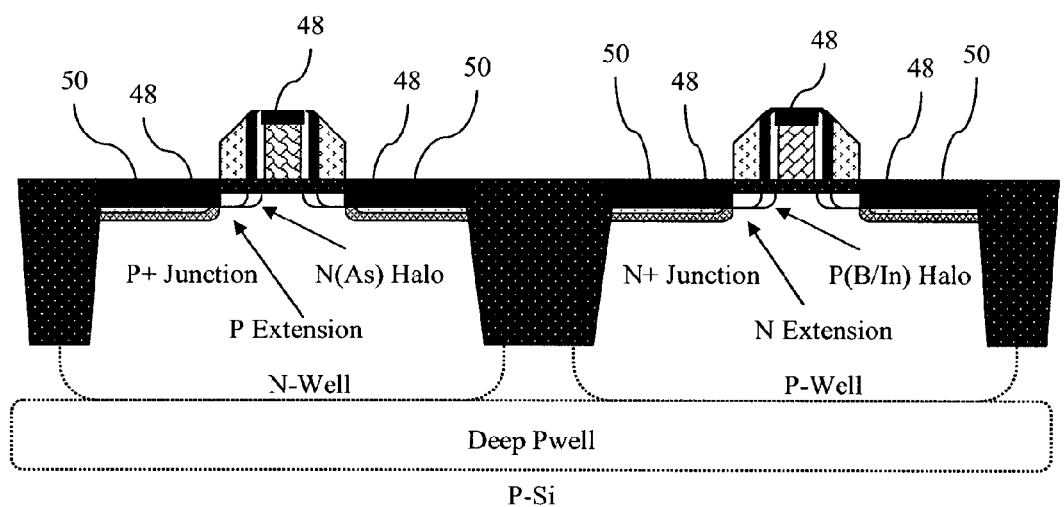
FIG. 2 illustrates a CMOS device created by a method of the invention.

As illustrated in FIG. 2, a conductive material 48, such as silicide or other similar material, is formed on the top region of the gate stacks 20, 22 and in source/drain regions 50, i.e., the regions of the CMOS device that are adjacent the spacers 24, 26. The conductive material 48 may be formed by uniformly depositing a layer of a refractory metal, such as cobalt, titanium, nickel, or any other transition metal, over the surface of the substrate 10, using PVD, CVD, sputtering, or other similar process. The metal is then annealed, for example, exposed to 500.degree. C. for about 80 seconds. During the annealing process the metal diffuses into the exposed regions of silicon to form silicide. Thereafter, non-reacted cobalt metal is chemically removed.

Thus, embodiments herein present a method for a feed forward silicide control scheme based on spacer height controlling pre-clean time. The method forms FET gates (i.e., gate stacks 20, 22) over a substrate (i.e., substrate 10 of the CMOS device). The FET gates can comprise polysilicon or other similar materials. Next, spacers (i.e., spacers 24, 26) are formed on the gates. As described above, the spacers may be formed using an oxidation process wherein oxide is deposited or grown on the sidewalls of the gates using chemical-vapor deposition, plasma-enhanced chemical-vapor deposition, or another similar process. The oxide is then etched using a reactive ion etch or other similar process.

Following formation of the spacers, the method measures the spacers using any appropriate tool, such as an atomic force microscope. The measured spacer height is fed forward to the HF/EG etch (i.e., the pre-clean process, pre-cleaning etch, pre-silicide etch), wherein the measured spacer height determines the duration of the HF/EG etch. Thus, the method then conducts the pre-cleaning etch using hydrofluoric ethylene glycol (HF/EG), wherein the duration of the pre-cleaning is adjusted according to the measured spacer height. If the measured spacer height is below a predetermined amount, the duration of the pre-cleaning is reduced; if the measured spacer height is above a predetermined amount, the duration of the pre-cleaning is increased.

By adjusting the duration of the pre-cleaning etch according to the measured spacer height, shifting of the gates (moving gate positions relative to other features) and spacer pull-down (an undesirable removal of spacer material from the sides of the gates) are avoided. Moreover, by adjusting the duration of the pre-cleaning etch according to the measured spacer height, all the spacers can have identical heights, which facilitates consistent semiconductor resistance.

After the HF/EG etch, silicide (i.e., conductive material 48) is formed on the substrate and the gates. For example, as described above, silicide may be formed by uniformly depositing a layer of a refractory metal over the surface of the substrate. The metal is then annealed, wherein the metal diffuses into the exposed regions of silicon to form silicide. Thereafter, non-reacted cobalt metal is chemically removed.

Figure 3:
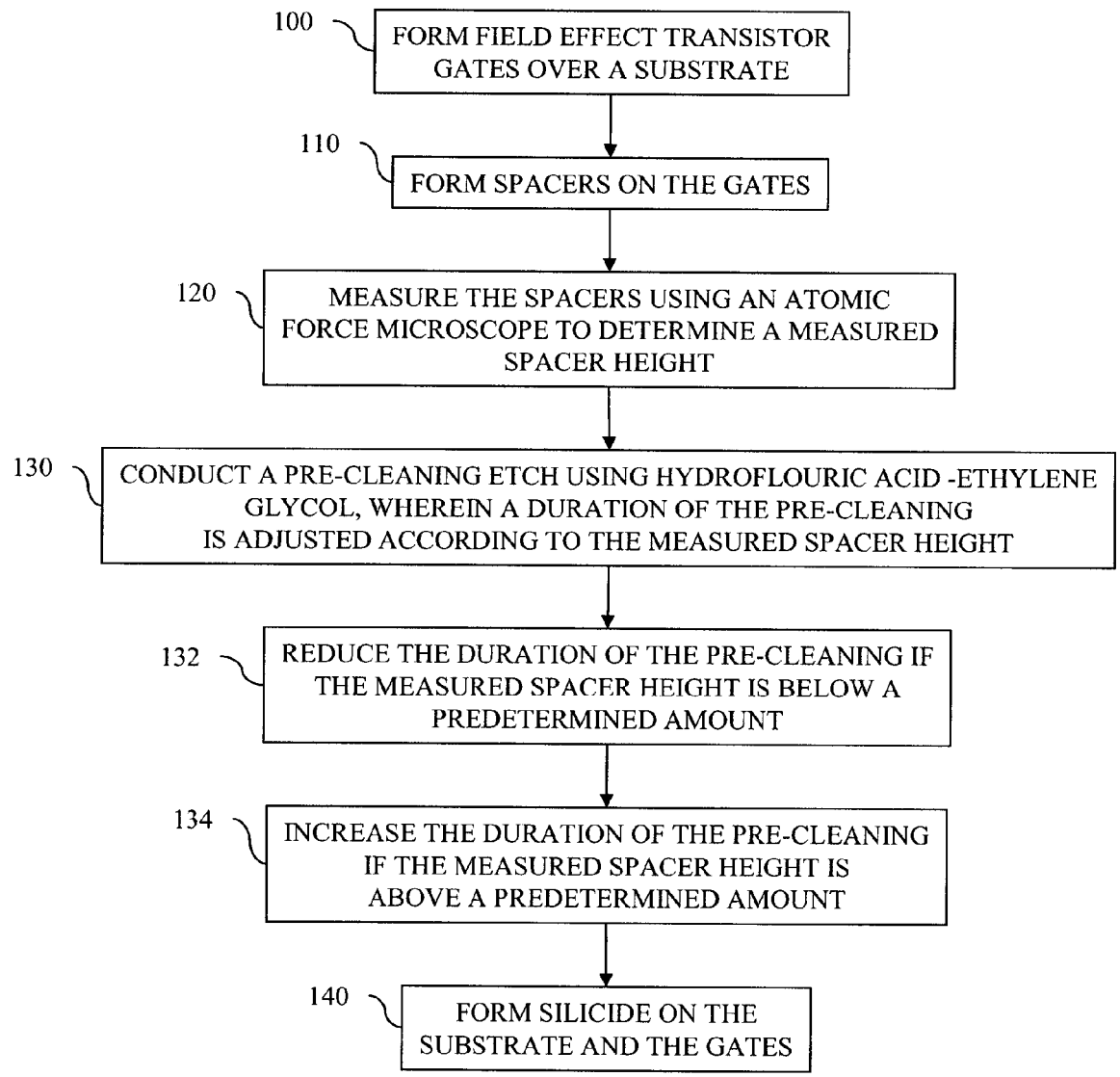
FIG. 3 illustrates a flow diagram of a method of the invention.

FIG. 3 illustrates a flow diagram of a method for a feed forward silicide control scheme based on spacer height controlling pre-clean time. In item 110, FET gates are formed over a substrate. The FET gates can comprise polysilicon or other similar materials. Next, in item 110, spacers are formed on the sidewalls of the gates, wherein the spacers may comprise an oxide material, or other similarly used material.

Following this, in item 120, the spacers are measured using an atomic force microscope. As described above, a measured spacer height is determined and fed forward to a pre-cleaning etch, wherein the measured spacer height determines the duration of the pre-cleaning etch. Thus, in item 130, the pre-cleaning etch is conducted, wherein the pre-cleaning is conducted using hydrofluoric ethylene glycol, and wherein the duration of the pre-cleaning is adjusted according to the measured spacer height determined in item 120. In item 132, the duration of the pre-cleaning is reduced if the measured spacer height is below a predetermined amount. In item 134, the duration of the pre-cleaning is increased if the measured spacer height is above a predetermined amount.

Subsequently, in item 140, silicide is formed on the substrate and the gates. More specifically, as described above, silicide is formed on the top of the gates and in the regions of the substrate that are adjacent the spacers. The silicide may be formed by uniformly depositing a layer of cobalt or titanium over the surface of the substrate using PVD, CVD, sputtering, or another similar process. The metal is then annealed and the non-reacted cobalt metal is chemically removed.

Accordingly, the method measures spacer shoulder height with, for example, an atomic force microscope, and feeds this information forward to a pre-silicide HF/EG etch. The HF/EG etch time can be adjusted according to the spacer step height measurement. Since the device is already formed at the HF/EG step, there is no danger of shifting the device, and since the spacer height can be made consistent, good silicide formation is guaranteed, and consistency is improved as well.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A method, comprising:

forming field effect transistor gates over a substrate;

forming spacers on said gates;

measuring said spacers to determine a measured spacer height;

conducting a pre-cleaning etch, wherein a duration of said pre-cleaning is adjusted according to said measured spacer height; and forming silicide on said substrate and said gates.

2. The method according to claim 1, wherein said duration of said pre-cleaning is reduced if said measured spacer height is below a predetermined amount.

3. The method according to claim 1, wherein said duration of said pre-cleaning is increased if said measured spacer height is above a predetermined amount.

4. The method according to claim 1, wherein said conducting of said pre-cleaning etch is conducted using one of hydrofluoric ethylene glycol, hydrofluoric acid, and buffered hydrofluoric acid.

5. The method according to claim 1, wherein said measuring of said spacers is performed using an atomic force microscope.

6. The method according to claim 1, wherein by adjusting said duration of said pre-cleaning etch according to said measured spacer height, shifting of said gates is avoided.

7. The method according to claim 1, wherein by adjusting said duration of said pre-cleaning etch according to said measured spacer height, spacer pull-down is avoided.

8. The method according to claim 1, wherein by adjusting said duration of said pre-cleaning etch according to said measured spacer height, all said spacers have identical heights.

9. A method, comprising:

forming field effect transistor gates over a substrate;

forming spacers on said gates;

measuring said spacers to determine a measured spacer height;

conducting a pre-cleaning etch using one of hydrofluoric ethylene glycol, hydrofluoric acid, and buffered hydrofluoric acid, wherein a duration of said pre-cleaning etch is adjusted according to said measured spacer height; and forming silicide on said substrate and said gates.

10. The method according to claim 9, wherein said duration of said pre-cleaning is reduced if said measured spacer height is below a predetermined amount.

11. The method according to claim 9, wherein said duration of said pre-cleaning is increased if said measured spacer height is above a predetermined amount.

12. The method according to claim 9, wherein said measuring of said spacers is performed using an atomic force microscope.

13. The method according to claim 9, wherein by adjusting said duration of said pre-cleaning etch according to said measured spacer height, shifting of said gates is avoided.

14. The method according to claim 9, wherein by adjusting said duration of said pre-cleaning etch according to said measured spacer height, spacer pull-down is avoided.

15. The method according to claim 9, wherein by adjusting said duration of said pre-cleaning etch according to said measured spacer height, spacer pull-down is avoided.

16. A method, comprising:

forming field effect transistor gates over a substrate;

forming spacers on said gates;

measuring said spacers to determine a measured spacer height;

conducting a pre-cleaning etch, wherein a duration of said pre-cleaning etch is adjusted according to said measured spacer height, and wherein said duration of said pre-cleaning is changed if said measured spacer height deviates from a predetermined height; and forming silicide on said substrate and said gates.

17. The method according to claim 16, wherein said duration of said pre-cleaning is increased if said measured spacer height is above a predetermined amount.

18. The method according to claim 16, wherein said conducting of said pre-cleaning etch is conducted using ethylene glycol.

19. The method according to claim 16, wherein said measuring of said spacers is performed using an atomic force microscope.

20. The method according to claim 16, wherein by adjusting said duration of said pre-cleaning etch according to said measured spacer height, shifting of said gates is avoided.

\* \* \* \* \*